US006784854B1

(12) United States Patent
Yukl

(10) Patent No.: US 6,784,854 B1
(45) Date of Patent: Aug. 31, 2004

(54) DIELECTRIC DETECTION THROUGH CONDUCTIVE METAL

(75) Inventor: Tex Yukl, Juliaetta, ID (US)

(73) Assignee: Spatial Dynamics, Ltd., Juliaetta, ID (US)

( * ) Notice: Subject to any disclaimer, the term of this patent is extended or adjusted under 35 U.S.C. 154(b) by 26 days.

(21) Appl. No.: 10/387,725

(22) Filed: Mar. 12, 2003

Related U.S. Application Data

(60) Provisional application No. 60/367,954, filed on Mar. 25, 2002.

(51) Int. Cl.[7] ......................... H01Q 15/08; G01R 27/04

(52) U.S. Cl. ............................... 343/911 L; 343/911 R; 324/639; 324/642

(58) Field of Search ......................... 343/911 L, 911 R, 343/912, 753, 761, 755; 324/639, 642; H01Q 15/08, 73/12; G01R 27/04

(56) References Cited

U.S. PATENT DOCUMENTS 4,234,844 A 11/1980 Yukl ..................... 324/58.5 A
4,269,514 A * 5/1981 Vossberg .................... 356/639
4,318,108 A * 3/1982 Yukl .......................... 343/753
4,532,939 A 8/1985 Yukl .......................... 128/804
4,878,059 A 10/1989 Yukl .......................... 343/753
4,912,982 A 4/1990 Yukl ........................ 73/861.05
4,947,848 A 8/1990 Yukl ...................... 128/653 R
4,949,094 A 8/1990 Yukl .......................... 343/785
4,975,968 A 12/1990 Yukl ............................. 382/1
5,083,089 A 1/1992 Yukl .......................... 324/632
6,057,761 A 5/2000 Yukl ........................ 340/568.1

* cited by examiner

*Primary Examiner*—Don Wong
*Assistant Examiner*—Trinh Vo Dinh
(74) *Attorney, Agent, or Firm*—Jon M. Dickinson, P.C.; Robert D. Varitz, P. .

(57) ABSTRACT

Apparatus and methodology utilizing nearfield microwave technology to detect contraband/forbidden substances concealed within metallic containers. Apparatus and methodologic microwave operating frequency determines the metallic thickness through which detection is possible, and also the expectable "depths" for detection within a metallic container. Special and important attention is paid to the appropriate positional and distance locating of the invention apparatus relative to a suspected "substance-containing" metallic container for detection to be most effective. Preferably, this distance is substantially equal to the closest distance from the central radiating plane of a lens/antenna (which is employed, according to a preferred practice of the invention) at which a conductive, metallic surface will regeneratively parasitize the lens/antenna.

5 Claims, 1 Drawing Sheet

DIELECTRIC DETECTION THROUGH CONDUCTIVE METAL

CROSS REFERENCE TO RELATED APPLICATION

This application claims priority to the filing date of co-pending U.S. Provisional Application, Ser. No. 60/367/954, filed Mar. 25, 2002 for "Dielectric Detection Through Conductive Metal". The entire contents of that provisional patent application are hereby incorporated herein by reference.

INTRODUCTION

This invention relates to substance detection based upon substance dielectric characteristics, and more specifically to apparatus and a method utilizing near-field microwave technology for detecting and identifying the presence (dielectric "signatures") of selected kinds of substances which are hidden behind an electrically conductive metal expanse.

While there are many fields of application for this invention, a preferred and best mode embodiment of, and manner of practicing, the invention are described and illustrated herein in the context of detecting contraband and/or dangerous substances, such as certain drugs and explosives, which may be carried clandestinely concealed in otherwise innocuous, sealed metal containers, such as in cans of olive oil.

Near-field microwave technology has established itself as a powerful and versatile tool for detecting, via observing dielectric characteristics of, various substances that prove to be illusive, even invisible, to other detection modes. This technology and its detection capability are timely, and are of great interest today especially in the heightened sense of concern that people feel and express for personal security in places such as airports and aircraft.

A number of now-issued U.S. patents describe and attest to the power and versatility of microwave detection practices, and these patents include:

U.S. Pat. No. 4,234,844, Electromagnetic Noncontacting Measuring Apparatus

U.S. Pat. No. 4,318,108, Bidirectionally Focussing Antenna

U.S. Pat. No. 4,532,939, Noncontacting, Hyperthermia method and Apparatus of Destroying Living Tissue in Vivo U.S. Pat. No. 4,878,059, Farfield/Nearfield Transmission/Reception Antenna U.S. Pat. No. 4,912,982, Non-Perturbing Cavity Method and Apparatus for Measuring Certain Parameters of Fluid Within a Conduit U.S. Pat. No. 4,947,848, Dielectric-Constant Change Monitoring U.S. Pat. No. 4,949,094, Nearfield/Farfield Antenna with Parasitic Array U.S. Pat. No. 4,975,968, Timed Dielectrometry Surveillance Method and Apparatus U.S. Pat. No. 5,083,089, Fluid Moisture Ratio Monitoring Method and Apparatus U.S. Pat. No. 6,057,761, Security System and Method The contents of each of these just-mentioned patents are hereby incorporated herein by reference.

The present invention, while based in part upon certain structures and methodologies expressed in these patents, makes a significant departure in the form of my recent discovery that, under special structural and methodologic circumstances, it is possible to employ nearfield microwave technology effectively to "see through" an otherwise, and normally thought of, occluding barrier expanse of conductive metal, thus to detect various metal-hidden substances of societal concern, such as illegal drugs, and explosives. Prior detection approaches utilizing the specific technology described in the patents listed above have, by contrast, involve substance detection through shrouding or intervening media which is not formed of metal. By including the new capabilities offered by the present invention, the "escape hatch" of metallic hiding or shrouding employed by those engaged in such practices is easily and significantly checked.

The manners of implementing and practicing this invention, and their respective advantages and contributions to the art, will become quite fully apparent from the following detailed descriptions of the preferred and best mode embodiment, and manner of practicing, the invention, especially as read in light of the accompanying illustrative drawings.

DETAILED DESCRIPTION OF THE INVENTION

Figure 1:
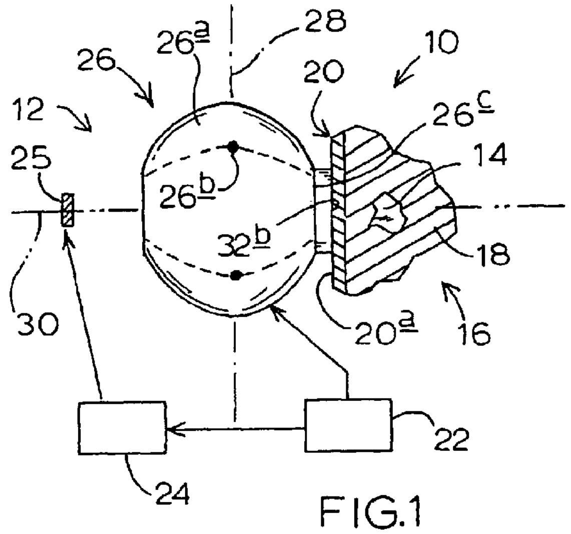
FIG. 1 is a simplified, schematic, partly fragmentary side view of apparatus constructed in accordance with a preferred embodiment of the present invention.
Figure 2:
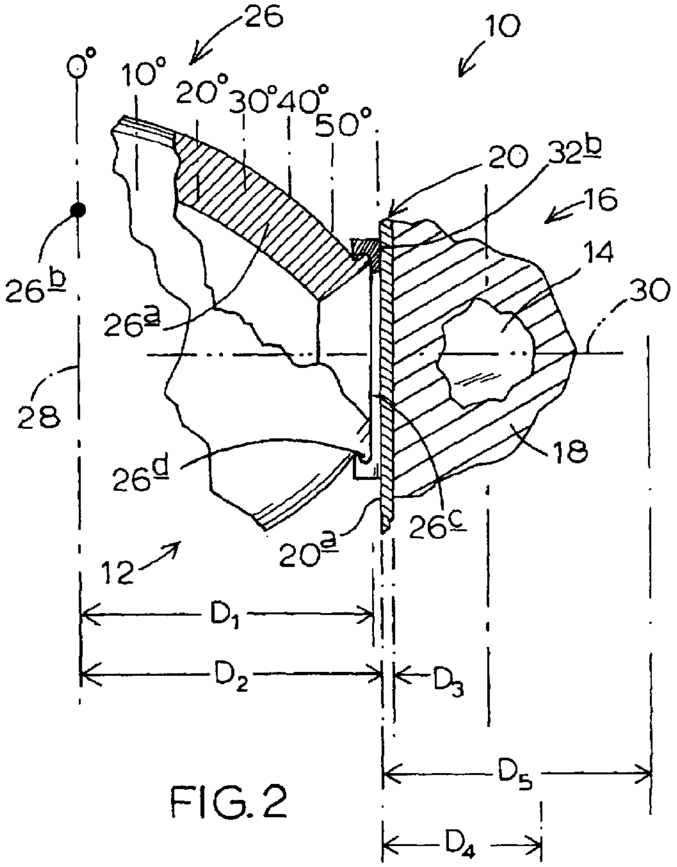
FIG. 2 is an enlarged, fragmentary detail generally drawn from a portion of FIG. 1.
Figure 3:
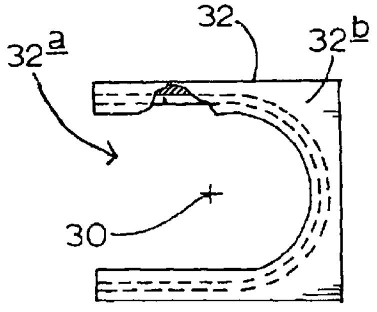
FIG. 3 illustrates, in a isolated fashion, an attachable/detachable component which is employed in the invention embodiment illustrated in FIGS. 1 and 2 to define what is referred to herein as an interrogation face.

Turning now to the drawings, and referring initially to FIGS. 1–3, inclusive, indicated generally at 10 is a system including apparatus, or structure, 12 which is constructed in accordance with a preferred and best mode embodiment of the present invention. These three drawing figures also collaboratively join with text below in describing and illustrating the preferred methodology involving practice of the invention to detect a selected substance 14, such as a contraband drug, like cocaine, which is packaged and "hidden" inside a sealed container (generally shown fragmentarily at 16), which container otherwise contains an innocuous substance, such as olive oil shown fragmentarily at 18, all shrouded, or jacketed, by a can (not fully shown) formed by sheet metal 20. Sheet metal 20, also referred to herein as a conductive expanse (an electrically conducted expanse), has an outside exposed surface 20*a*, and is formed herein of a typical metallic "canning" material, such as steel or aluminum. Expanse 20 herein has a typical can-wall thickness of about 0.09-inches. Substance 14 has been clandestinely concealed behind metallic expanse 20 (in the "can") with the likely confident view that it is probably undetectable by most, if not all, conventional contraband scanning technologies, principally because of the presence of metallic jacketing.

The structure and methodology of the present invention function in the nearfield of microwave electromagnetic radiation, and may be constructed to function essentially anywhere within the recognized microwave spectrum, ranging in frequency from about 300-MHz to about 30-GHz. Apparatus 12 as illustrated and now described herein is specifically designed to operate within this spectrum at the frequency of about 627-MHz—a frequency which has been found to work extremely effectively for the through-metal detection of substances, such a illegal drugs, like cocaine, as well as other illegal and/or dangerous contraband substances, such as various explosives. The wavelength λ in air of this operating frequency is about 18.83-inches. In general terms, whatever the operating wavelength is, the thickness of metal through which detection is most effective in accordance with this invention is about 0.005-λ. Given this chosen, and herein illustrative and representative, operating frequency, various dimensions expressed below, and illustrated in the drawings, are specific to this choice. How they would understandably need to be varied to accommodate other operating frequencies is a matter well known to those generally skilled in the relevant art. Such "relevant-art" knowledge will be aided by making reference to the above-identified, previously-issued U.S. patents.

Continuing with the description of what is shown in FIGS. 1–3, inclusive, generally included in system 10 for energizing apparatus 12, in accordance with practice of the invention, is an appropriate and conventional microwave power source 22, which is drivingly connected to apparatus 12, and also appropriate performance-monitoring apparatus 24 which monitors the functioning of apparatus 12, during use, to produce interpretable output information regarding through-metal detected substances. Further included in apparatus 12 is a torroidal receiver ring 25 which is appropriately positioned in the apparatus as will shortly be more fully explained.

Apparatus 24 may conveniently be otherwise conventional structure that typically observes certain electrical voltage, current and/or phase conditions extant in the operation of apparatus 12 during its "detecting and investigative use, to produce the mentioned interpretable output information which is preferably based upon pre-use, systemic "calibration".

It may be useful at this point in this text to point out that a reading of U.S. Pat. No. 4,234,844, referred to above, provides a very full description of apparatus quite like apparatus 12 herein, but there illustrated structured to perform a quite different kind of investigative operation.

Additionally included within apparatus 12, and also quite well discussed in the '844 patent just mentioned above, are a nearfield, bi-directionally radiating torroidally configured, body-of-revolution lens/antenna 26, having a body 26*a* formed of polystyrene, and a central, circular, driven radiating element 26*b*. Element 26*b* occupies a plane 28 which is disposed normal to the respective planes of FIGS. 1 and 2 in the drawings, with plane 28 also being disposed normal to the bi-directional radiation axis 30 (see the dash-double-dot lines in FIGS. 1 and 2) that lies within the planes of these two drawing figures. Plane 28 is referred to herein as the central radiating plane of lens/antenna 26. Axis 30 coincides with the axis of revolutional symmetry of lens/antenna body 26*a*. Power source 22 directly drives element 26*b* via an appropriate electrical driving connection established therewith (not specifically shown in detail).

In the embodiment of the invention now being described, the right side of lens/antenna body 26*a* terminates at an aperture which is shown at 26*c*, which aperture lies in a plane that substantially parallels plane 28 at a distance pictured in FIG. 2 as $D_1$. This distance preferably is substantially 0.15-λ, where λ is the wavelength of the operating frequency of apparatus 12 in air.

Formed as an annular projecting rim 26*d* which circumsurrounds aperture 26*b* is structure which is designed slideably to receive and support a spacer element which is constructed as illustrated in FIG. 3 and given reference numeral 32. As can be seen, spacer 32 has a somewhat U-shaped configuration as it is seen in FIG. 3, including an open side 32*a* which permits it to be slid onto rim 26*d* preferably in a very modest clearance-fit manner. This spacer is designed so that when it is fully seated in place, lens axis 30 resides in relation to the spacer at the location shown for this axis in FIG. 3. Spacer 32 is designed to define what is called herein an interrogation face 32*b* which lies at the distance designated $D_2$ in FIG. 2 from the nominal plane of driven element 26*b*. Distance $D_2$ herein preferably is about 0.25-λ This dimension, notably, defines the closest distance from the plane of driven element 26*b* at which a metal surface, such as surface 20*a* will regeneratively parasitize lens/antenna 26. Lens/antenna structure 26 and spacer 32 herein are collectively referred to as lens/antenna interrogation structure.

With respect to the capability of the structure and methodology of this invention to perform in relation to detecting substances through metallic expanses, and was mentioned earlier, it is preferably designed to work in conjunction with such metallic expanses that have thicknesses preferably about equal to or less than what is referred to herein as a defined fraction of λ, which fraction is preferably about 0.005 of λ This metal thickness consideration is illustrated as $D_3$ in FIG. 2.

During use, and following a calibration procedure which will be described, apparatus 12 is positioned relative to a metallic expanse, such as sheet metal 20, in a manner whereby the exposed outwardly facing face 32*b* of spacer 32 contacts the outer surface 20*a* of metal expanse 20, with lens/antenna axis 30 positioned to intersect the expected location of substance 14, as illustrated in FIGS. 1 and 2. Under these circumstances, the preferred range within which substance 14 lies to be easily detectably is indicated generally at $D_4$ in FIG. 2, and this range extends up to about 0.375-λ. A preferable maximum range within which substance detection is accomplishable is indicated at $D_5$ in FIG. 2, and this range extends to a distance of about 2.5-λ.

In preparation for utilizing apparatus 12 to detect a substance, such as substance 14, the apparatus is positioned with face 32*b* of spacer 32 in contact with surface 20*a* of the suspect metallic container, and with the driven element powered, the apparatus is slid in a surface manner over surface 20*a* to detect an voltage amplitude peak so-to-speak, as monitored by apparatus 24. This sliding-contact procedure is implemented in a manner whereby the radiation axis of the apparatus will, at some point, pass through any hidden contraband substance. With the apparatus positioned at a location where that peak is observed, a slight back and forth adjustment is made in the operating frequency of the system (a very modest adjustment) to fine-tune a maximum peak condition, and the apparatus is then in a condition actually detecting substance 14. The voltage-peak condition now in existence gives an indication regarding the dielectric characteristics of substance 14, and by correlating this observed peak with certain pre-calibration data, the nature of substance 14 can be interpreted for identification.

Pre-calibration is accomplished by performing the same "interrogation" process which has just been described for a selected variety of substances possessing essentially the sane expectable dielectric constants known to characterize "forbidden" substances. Voltage peaks associated with these known, pre-calibration materials are noted, and then later employed in a correlation process to identify hidden, unknown substances.

Figure 4:
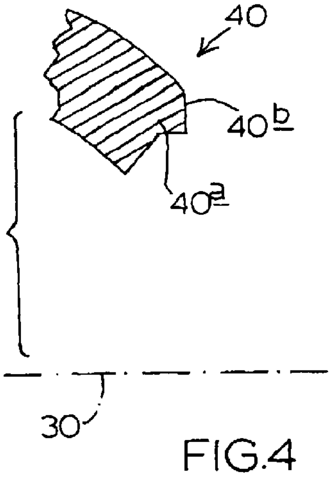
FIGS. 4 and 5 illustrate two different modifications of the invention. All of these figures can be viewed also as illustrating the practice and methodology of the invention. Structures shown in these drawing figures are not drawn to scale with one another.
Figure 5:
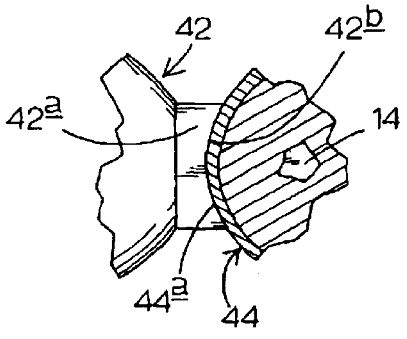

Turning finally now to the modifications shown in FIGS. 4 and 5, in FIG. 4 there is a fragmentary cross-sectional showing of a modified lens/antenna body structure 40. This modified body structure is made with aperture structure 40*a* that includes an "interrogation face" 40*b*.

FIG. 5 illustrates fragmentarily yet another modified lens/antenna body structure 42 which is built with an aperture structure 42*a* having a two-dimensionally, concavely shaped interrogation face 42*b*. This face is shaped to fit conformably with the outside surface 44*a* of a cylindrical metallic container 44. Another approach toward accommodating such curved container surfaces could include providing a collection of different spacers, like spacer 32, having differently curved interrogation surface selected to "fit" to the respective outside curved surfaces of various different cylindrical containers. Absolute complementary curvature matching, while preferred, is not required. Matching, and closely matching, curved interfaces of this nature are referred to herein as possessing "local coplanarity".

Accordingly, a preferred and best mode embodiment of, and manner of practicing the present invention, and certain variations thereof, have been illustrated and described. Other variations and modifications coming within the scope of the present invention are, of course, possible, and will be understood by those skilled in the art.

I claim:

1. Selected-frequency, microwave, energy-radiating apparatus for performing, in air, hidden substance detection through the thickness of a metallic expanse having a material characteristic which passes microwave energy, and where the metallic expanse has an exposed, accessible surface which is on the opposite side of the expanse relative to where the substance to be detected is located, the expanse has a thickness which is approximately equal to or less than a defined fraction of the operating wavelength λ in air of the selected microwave radiating frequency, and the setting of the hidden substance to be detected is such that that substance lies, relative to the expanse's mentioned, exposed surface, nominally within a distance therefrom of about 2.5-λ, said apparatus comprising an energizable, generally planar, driven element operable when energized to create, on opposite sides of its plane, bi-directional microwave-energy radiation having a selected frequency and wavelength λ, which radiation is directed along a radiation axis which is substantially normal to the plane of said element, and lens/antenna interrogation structure operatively associated with said driven element, and including a portion disposed toward one side of said element's plane having a defined interrogation face which normally lies effectively in a plane that substantially parallels the driven element's plane, and at a distance therefrom which is no greater than about 0.25-λ, use of the apparatus to detect a substance having the hidden setting generally described hereinabove involving placement of said interrogation face in complementary contact with the expanse's exposed surface, and in a manner generally causing the mentioned radiation axis to intersect the hidden substance.

2. The apparatus of claim 1, wherein the mentioned, defined fraction is substantially equal to 0.005-λ.

3. The apparatus of claim 1, wherein said interrogation face lies at a distance from the element's plane which is substantially equal to 0.25-λ.

4. The apparatus of claim 1, wherein the exposed surface of the metallic expanse referred to curves generally about an axis of revolution, and said interrogation face, with respect to its "effective plane", is shaped generally confrontingly to complement that curvature, whereby contact between the interrogation face and the exposed surface of the metallic expanse is characterized by "local coplanarity" at substantially each point of confronting contact.

5. A method employing selected-frequency microwave energy radiation for performing, in air, hidden substance detection through the thickness of a metallic expanse of a type having a material characteristic which passes microwave energy, and where that metallic expanse has an exposed and accessible surface which is on the opposite side of the expanse relative to where the substance to be detected is located, the expanse has a thickness which is approximately equal to or less than a defined fraction of the operating wavelength λ in air of the selected microwave radiating frequency, and the setting of the hidden substance to be detected is such that the substance lies, relative to the expanse's mentioned, exposed surface, nominally within a distance therefrom of about 2.5-λ, said method comprising providing an energizable, generally planar, driven element operable when energized to create, on opposite sides of its plane, bi-directional, microwave-energy radiation having a selected frequency and a wavelength λ, directing that radiation bi-directionally along an axis of radiation which is substantially normal to the plane of the driven element, associating with that driven element a lens/antenna interrogation structure which includes a portion disposed toward one side of the element's plane having a defined interrogation face which normally lies effectively in a plane that substantially parallels the driven element's plane at a distance therefrom which is no greater than about 0.25-λ, placing the mentioned interrogation face in complementary contact with the expanse's exposed surface in a manner generally causing the mentioned radiation axis to intersect the hidden substance, and from the opposite side of the driven element relative to the location of the hidden substance to be detected, monitoring at least one of (a) voltage, (b) current, and (c) operating-phase, characteristics of the radiated microwave energy as such is detectable from that side of the driven element in a manner allowing interpretation thereof which gives an indication of the nature of the hidden substance.

* * * * *